US012725497B2

(12) United States Patent
Chang et al.

(10) Patent No.: US 12,725,497 B2
(45) Date of Patent: Sep. 1, 2026

(54) UNMANNED AERIAL VEHICLE HAVING DISMANTLING STATUS DETERMINATION SYSTEM AND DISMANTLING STATUS DETERMINATION METHOD THEREOF

(71) Applicant: Qisda Corporation, Taoyuan City (TW)

(72) Inventors: Chih-Ming Chang, Taoyuan City (TW); Po-Fu Wu, Taoyuan City (TW)

(73) Assignee: QISDA CORPORATION, Taoyuan City (TW)

( * ) Notice: Subject to any disclaimer, the term of this patent is extended or adjusted under 35 U.S.C. 154(b) by 86 days.

(21) Appl. No.: 18/903,112

(22) Filed: Oct. 1, 2024

(65) Prior Publication Data

US 2025/0140088 A1 May 1, 2025

(30) Foreign Application Priority Data

Oct. 25, 2023 (CN) ........................ 202311392363.X

(51) Int. Cl.
*G08B 13/06* (2006.01)
*B64U 20/80* (2023.01)
*G01R 33/07* (2006.01)
*G08B 21/18* (2006.01)

(52) U.S. Cl.
CPC ............. *G08B 13/06* (2013.01); *B64U 20/80* (2023.01); *G01R 33/07* (2013.01); *G08B 21/182* (2013.01)

(58) Field of Classification Search
CPC ...... G08B 13/06; G08B 21/182; B64U 20/80; G01R 33/07
USPC .......................................................... 340/541
See application file for complete search history.

(56) References Cited

U.S. PATENT DOCUMENTS

| | | | | |
|---|---|---|---|---|
| 8,788,118 | B2 * | 7/2014 | Matos | B64D 45/0034 701/2 |
| 9,524,648 | B1 * | 12/2016 | Gopalakrishnan | G06F 21/00 |
| 9,578,766 | B2 * | 2/2017 | Jin | H04M 1/0245 |
| 11,192,633 | B1 * | 12/2021 | Moro-Ludena | B64C 11/008 |
| 11,203,443 | B2 * | 12/2021 | Liu | B64D 47/02 |
| 11,922,734 | B1 * | 3/2024 | Kellett | G07C 5/085 |
| 2009/0085761 | A1 * | 4/2009 | Buer | G08B 13/1427 340/686.1 |

(Continued)

FOREIGN PATENT DOCUMENTS

| | | |
|---|---|---|
| CN | 1519147 A | 8/2004 |
| CN | 107733975 A | 2/2018 |

*Primary Examiner* — Zhen Y Wu

(57) ABSTRACT

An unmanned aerial vehicle (UAV) having a dismantling status determination system is provided. The UAV includes a casing, having at least one casing assembly, and a dismantling status determination system. The dismantling status determination system includes a dismantling detection unit, a position detection unit, a storage unit, and a processing unit. The dismantling detection unit is disposed on the at least one casing assembly to provide a body status information according to whether the at least one casing assembly is detached. The position detection unit detects a current position of the UAV.

The storage unit stores a safe position list. When the processing unit determines that the at least one casing assembly is in the dismantling status, the processing unit determines whether the current position is included in the safe position list. If not, the processing unit determines that the dismantling status corresponds to an illegal dismantling action.

16 Claims, 4 Drawing Sheets

(56) References Cited

U.S. PATENT DOCUMENTS

| | | | | |
|---|---|---|---|---|
| 2015/0097558 | A1* | 4/2015 | Jin | H04B 1/3888 324/226 |
| 2018/0327091 | A1* | 11/2018 | Burks | B64U 50/13 |
| 2019/0235494 | A1* | 8/2019 | Cantrell | G06V 20/17 |
| 2019/0308746 | A1* | 10/2019 | Taveira | B60R 25/305 |
| 2019/0310628 | A1* | 10/2019 | Taveira | B64D 45/0031 |
| 2020/0108945 | A1* | 4/2020 | Liu | B64F 5/40 |
| 2022/0083987 | A1* | 3/2022 | Bhunia | G05D 1/101 |
| 2024/0309854 | A1* | 9/2024 | Jensen | F03D 80/50 |
| 2025/0108917 | A1* | 4/2025 | Alam | G05D 1/101 |

* cited by examiner

UNMANNED AERIAL VEHICLE HAVING DISMANTLING STATUS DETERMINATION SYSTEM AND DISMANTLING STATUS DETERMINATION METHOD THEREOF

This application claims the benefit of People's Republic of China application Serial No. 202311392363.X, filed Oct. 25, 2023, the subject matter of which is incorporated herein by reference.

BACKGROUND OF THE INVENTION

Field of the Invention

The invention relates in general to an unmanned aerial vehicle (UAV) and a dismantling status determination method thereof, and more particularly to an unmanned aerial vehicle having a dismantling status determination system and a dismantling status determination method thereof.

Description of the Related Art

Unmanned aerial vehicle (UAV) refers to a flight device without a pilot. Unmanned aerial vehicle has a manual flight mode and an auto flight mode. In the manual flight mode, the unmanned aerial vehicle is controlled by a remote controller. In the auto flight mode, the unmanned aerial vehicle is controlled by a control system to take off and fly automatically. Unmanned aerial vehicle can land on different environments and execute various tasks. As the unmanned aerial vehicle is now used to execute confidential tasks, data confidentiality become particularly important. However, when the unmanned aerial vehicle is executing a task, ill-intentioned people may try to obtain the information stored in the unmanned aerial vehicle by trapping unmanned aerial vehicle using illegal means. To resolve the above problem, it has become a prominent task for the industry to provide an unmanned aerial vehicle capable of determining whether the holder of the unmanned aerial vehicle has the intention to steal the confidential information stored in the unmanned aerial vehicle.

SUMMARY OF THE INVENTION

The invention is directed to an unmanned aerial vehicle (UAV) and a dismantling status determination method thereof. When it is doubted that the unmanned aerial vehicle may be dismantled by other people, whether the dismantling action is legal can be determined according to whether current position of the unmanned aerial vehicle is included in a safe position list.

According to one embodiment of the present invention, an unmanned aerial vehicle (UAV) is provided. The unmanned aerial vehicle includes a casing and a dismantling status determination system. The casing has at least one casing assembly. The dismantling status determination system includes a dismantling detection unit, a position detection unit, a storage unit, and a processing unit. The dismantling detection unit is disposed on at least one casing assembly and provides a body status information according to whether at least one casing assembly is detached. The position detection unit detects a current position of the unmanned aerial vehicle. The storage unit stores a safe position list. The processing unit is coupled to the dismantling detection unit, the position detection unit, and the storage unit. When the processing unit determines that the at least one casing assembly is in the dismantling status according to the body status information, the processing unit determines whether the current position is included in the safe position list. When the current position is not included in the safe position list, the processing unit determines that the dismantling status corresponds to an illegal dismantling action.

According to another embodiment of the present invention, a dismantling status determination method used in an unmanned aerial vehicle is provided. The unmanned aerial vehicle includes a casing having at least one casing assembly. The dismantling status determination method includes the following steps. Firstly, a body status information is provided according to whether at least one casing assembly is detached. Next, a current position of the unmanned aerial vehicle is detected. Then, whether at least one casing assembly is in the dismantling status is determined according to the body status information. When at least one casing assembly is in the dismantling status, whether the current position is included the safe position list stored in the storage unit is determined. When the current position is not included in the safe position list, it is determined that the dismantling status corresponds to an illegal dismantling action.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of each embodiment of the present invention are disclosed below with reference to accompanying drawings. Apart from the detailed descriptions, any embodiments in which the present invention can be used as well as any substitutions, modifications or equivalent changes of the said embodiments are within the scope of the present invention, and the descriptions and definitions in the claims shall prevail. Many specific details and embodiments are disclosed in the specification for anyone ordinary skilled in the art to comprehensively understand the present invention, not for limiting the present invention. Moreover, generally known procedures or elements are not disclosed to avoid adding unnecessary restrictions to the present invention.

Figure 1:
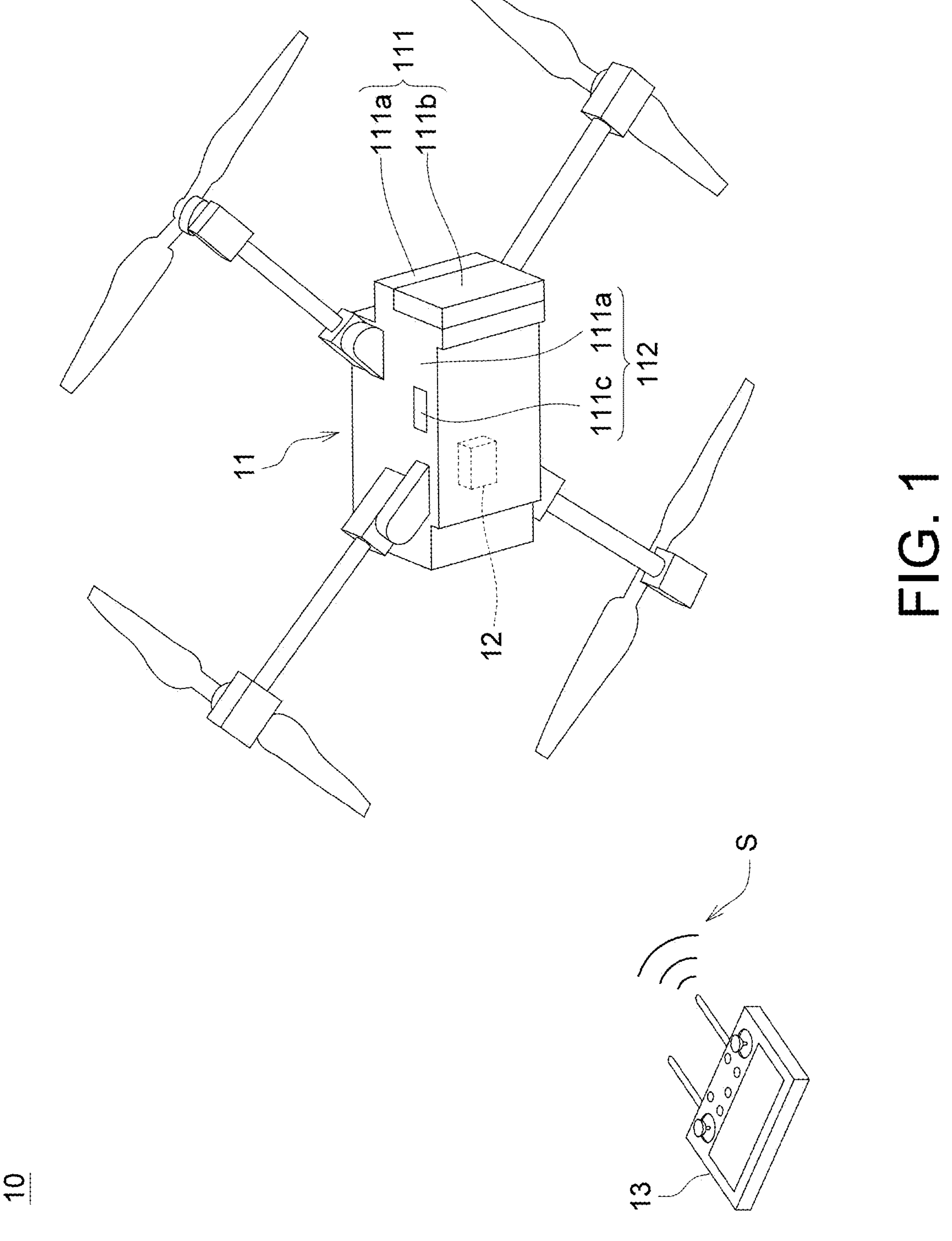
FIG. 1 is a schematic diagram of an unmanned aerial vehicle according to an embodiment of the invention.

Referring to FIG. 1, a schematic diagram of an unmanned aerial vehicle 10 according to an embodiment of the invention is shown. The unmanned aerial vehicle 10 includes a casing 11, a dismantling status determination system 12, and a controller 13. The dismantling status determination system 12 and the controller 13 are accommodated in the casing 11.

The controller 13 may emit a control signal S to control the flight of the unmanned aerial vehicle 10. The casing 11 has at least one casing assembly, such as a casing assembly 111 and a casing assembly 112. The casing assembly 111 and the casing assembly 112 respectively include two mutually detachable elements. For instance, the casing assembly 111 may include a casing body 111*a* and a cover 111*b*, and the user can open the cover 111*b* when internal parts of the unmanned aerial vehicle 10 need to be fixed or serviced. The casing assembly 112 may include a casing body 111*a* and a protection cover 111*c*. The protection cover 111*c* covers at least one data transmission port or pluggable memory card. When data need to be transmitted or accessed, the user can open the protection cover 111*c* then connects a transmission line to the data transmission port or unplugs the memory card. Once the cover 111*b* or the protection cover 111*c* moves away from the casing body 111*a*, the dismantling status determination system 12 can determine whether the dismantling status corresponds to a legal or illegal dismantling action.

Figure 2:
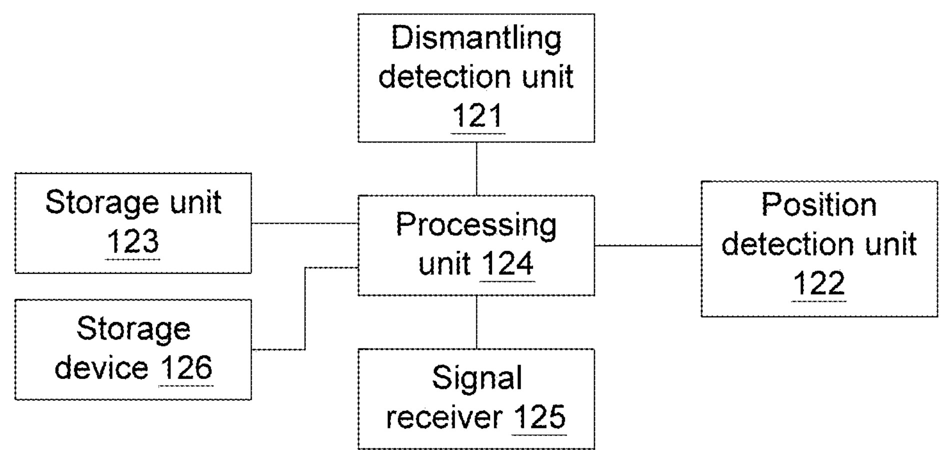
FIG. 2 is a block diagram of a dismantling status determination system of an unmanned aerial vehicle according to an embodiment of the invention.

FIG. 2 is a block diagram of a dismantling status determination system 12 of an unmanned aerial vehicle 10 according to an embodiment of the invention. Refer to FIG. 1 and FIG. 2. The dismantling status determination system 12 may include a dismantling detection unit 121, a position detection unit 122, a storage unit 123, a processing unit 124, and a signal receiver 125. The processing unit 124 is coupled to the dismantling detection unit 121, the position detection unit 122, the storage unit 123, and the signal receiver 125. The processing unit 124, which can be included in a processor in the form of software elements (such as program code, instructions, data, files), hardware elements (such as logic circuits, integrated circuits, chips, circuit boards) or a combination thereof, can function under the control of the processor. The signal receiver 125 can receive a control signal S provided by the controller 13.

Figure 3:
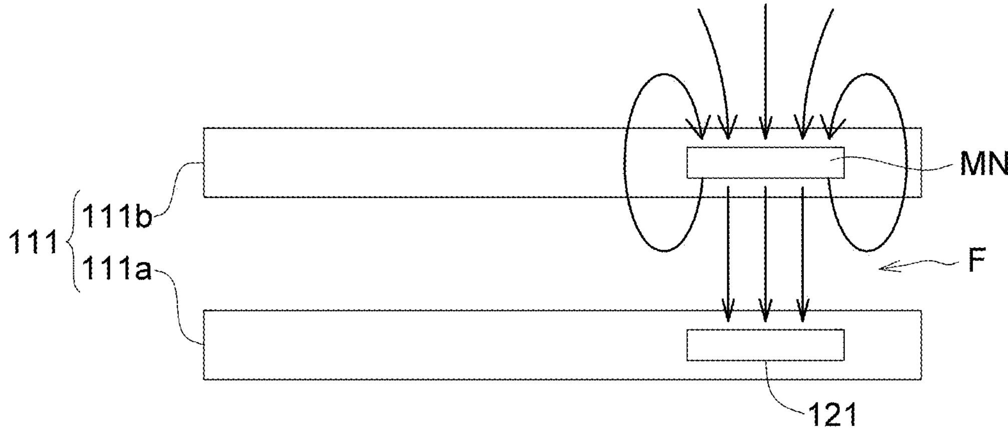
FIG. 3 is an example of the dismantling detection unit being a Hall sensor according to an embodiment of the invention.

The dismantling detection unit 121 is disposed on at least one casing assembly of the unmanned aerial vehicle 10, such as casing assemblies 111 and 112, for providing a body status information according to whether the at least one casing assembly is detached. In an embodiment, the dismantling detection unit 121 can be implemented by a Hall sensor. FIG. 3 is an example of the dismantling detection unit 121 being a Hall sensor according to an embodiment of the invention. As indicated in FIG. 3, the dismantling detection unit 121 is disposed on the casing body 111*a* of the casing assembly 111; a magnetic element MN is disposed on the cover 111*b* of the casing assembly 111. The position of the magnetic element MN corresponds to the dismantling detection unit 121, so that the dismantling detection unit 121 can detect a magnetic field F of the magnetic element MN. Once the magnetic field F changes, for instance, when the cover 111*b* and the casing body 111*a* are apart from each other, the dismantling detection unit 121 immediately senses the change in the magnetic field F then provides a body status information.

The position detection unit 122 is used to detect a current position of the unmanned aerial vehicle 100. In an embodiment, the position detection unit 122 can obtain the GPS coordinates of the unmanned aerial vehicle 100 through the global positioning system (GPS).

The storage unit 123, which can be implemented by such as a hard disc, a memory cared or a memory, is used to store a safe position list. The safe position list, which can be pre-set, records all position information that have be verified or trusted. For instance, the verified or trusted positions may include base station positions, maintenance station positions, practice station positions, and so on. The verified or trusted positions also may include a takeoff position of the unmanned aerial vehicle 10. In an embodiment, the verified or trusted position information can be GPS coordinates.

In an embodiment, the safe position list is modifiable. For instance, the base station positions, maintenance station positions, practice station positions, and so on that have been included in the safe position list can be update. Apart from the base station positions, maintenance station positions, practice station positions, and so on, other verified or trusted positions can be added to the safe position list. In an embodiment, when the unmanned aerial vehicle 10 takes off from a position for the first time, the processing unit 124 can add the takeoff position to the safe position list according to a current position detected by the position detection unit 122. In an embodiment, as the takeoff position of the unmanned aerial vehicle 10 varies, the processing unit 124 can timely add the takeoff position to the safe position list according to the current position detected by the position detection unit 122.

Figure 4:
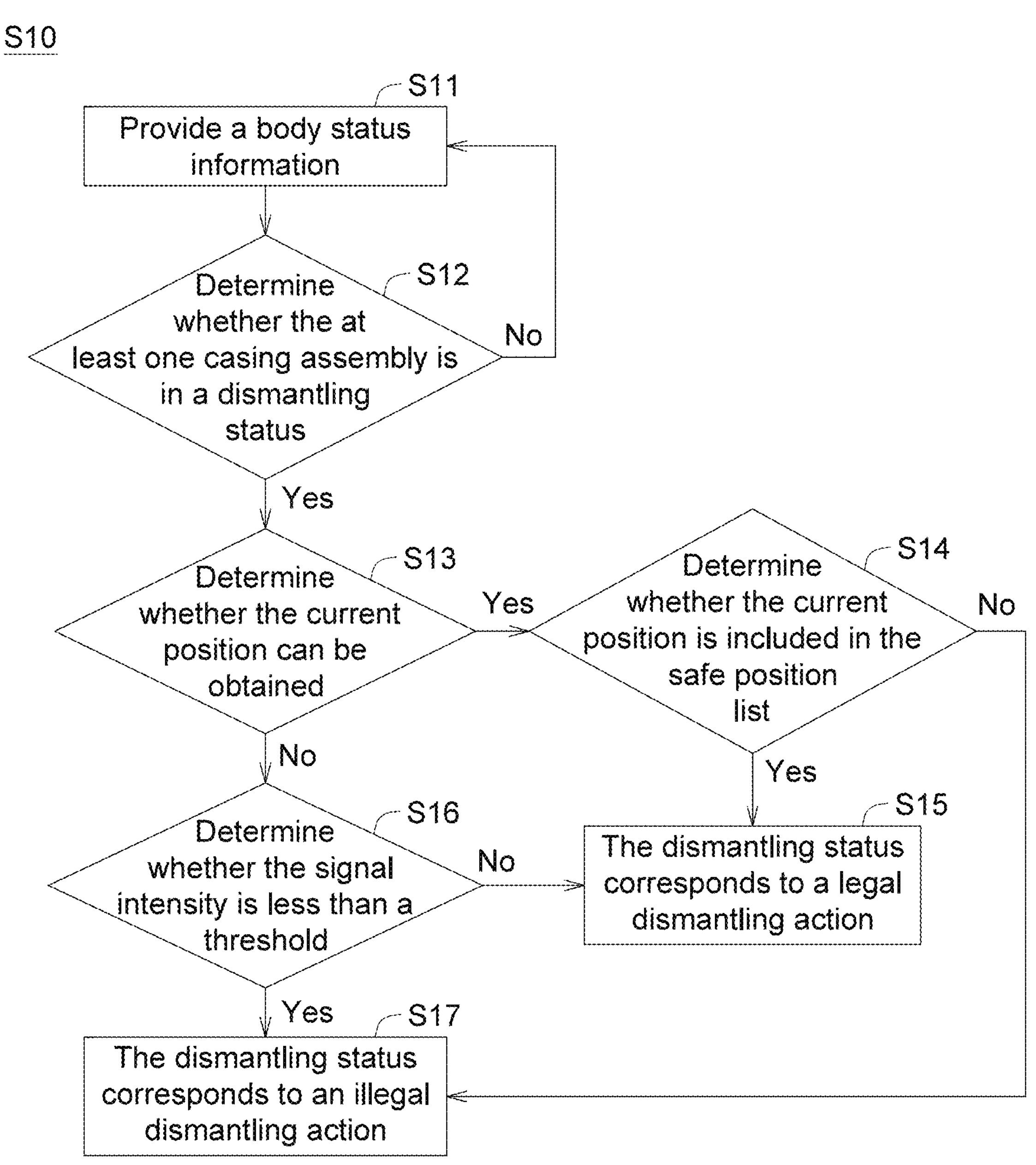
FIG. 4 is a flowchart of a dismantling status determination method of an unmanned aerial vehicle according to an embodiment of the invention.

FIG. 4 is a flowchart of a dismantling status determination method S10 of an unmanned aerial vehicle 10 according to an embodiment of the invention. Refer to FIG. 1, FIG. 2, and FIG. 4. The dismantling status determination method S10 includes the following steps. In step S11, a body status information is provided by the dismantling detection unit 121. In step S12, whether at least one casing assembly is in a dismantling status is determined by the processing unit 124 according to the body status information provided in step S11. When the at least one casing assembly is not in a dismantling status, the method returns to step S11. When the processing unit 124 determines that the at least one casing assembly is in a dismantling status, the method proceeds to step S13. In the embodiment of FIG. 3, when the cover 111*b* and the casing body 111*a* are apart from each other, the dismantling detection unit 121 can sense a change in the magnetic field F then provide a body status information. The processing unit 124 can determine that the casing assembly 111 is currently in a dismantling status according to the body status information.

In step S13, whether the current position of the unmanned aerial vehicle 10 can be obtained is determined by the processing unit 124. For instance, when the position detection unit 122 can detect the current position of the unmanned aerial vehicle 10, the processing unit 124 determines that the result of step S13 is "Yes", and the method proceeds to step S14. In step S14, whether the current position of the unmanned aerial vehicle 10 is included in the safe position list is determined by the processing unit 124 according to the safe position list stored in the storage unit 123. When the current position of the unmanned aerial vehicle 10 is included in the safe position list, this indicates that the unmanned aerial vehicle 10 currently is at a verified or trusted position, and the processing unit 124 determines that the dismantling status of the at least one casing assembly corresponds to a legal dismantling action, as indicated in step S15. For instance, when the position detection unit 122 detects that the current position of the unmanned aerial vehicle 10 is the GPS coordinates of a maintenance station position and the processing unit 124 determines that the GPS coordinates of the maintenance station position is already included in the safe position list of the storage unit 123, the processing unit 124 determines that the dismantling status corresponds to a legal dismantling action.

In step S14, when the processing unit 124 determines that the current position of the unmanned aerial vehicle 10 is not included in the safe position list, which indicates that the unmanned aerial vehicle 10 currently is not in a verified or trusted position and possibly may have been intercepted by someone who tries to steal confidential information, the processing unit 124 determines that the dismantling status of the at least one casing assembly corresponds to an illegal dismantling action as indicated in step S17.

In an embodiment, when it is determined that the dismantling status of the at least one casing assembly corresponds to an illegal dismantling action, the processing unit 124 can erase the data stored in the storage unit 123 and/or any storage device 126 of the unmanned aerial vehicle 10 to avoid the confidential information being stolen by ill-intentioned people.

In step S13, when the position detection unit 122 cannot detect the current position of the unmanned aerial vehicle 10, the processing unit 124 determines that the result of step S13 is "No", and the method proceeds to step S16. For example, when the unmanned aerial vehicle 10 is interrupted by a signal interrupter and cannot receive GPS signals, the position detection unit 122 will be unable to detect the current position of the unmanned aerial vehicle 10. In step S16, whether the intensity of the control signal S of the controller 13 is less than a threshold is determined by the processing unit 124. When it is determined that the intensity of the control signal S is less than the threshold, which indicates that the unmanned aerial vehicle 10 is currently outside the control range of the controller 13 and may have entered an unsafe position or the control signal S of the controller 13 may have been blocked, the processing unit 124 determines that the dismantling status of the at least one casing assembly corresponds to an illegal dismantling action as indicated in step S17. When the determination of step S16 shows that the intensity of the control signal S is not less than the threshold (such as greater than or equivalent to the threshold), which indicates that the unmanned aerial vehicle 10 currently is still within the control range of the controller 13, that is, the flight of the unmanned aerial vehicle 10 still can be controlled by using the controller 13, the processing unit 124 determines that the dismantling status of the at least one casing assembly corresponds to a legal dismantling action as indicated in step S15.

Figure 5:
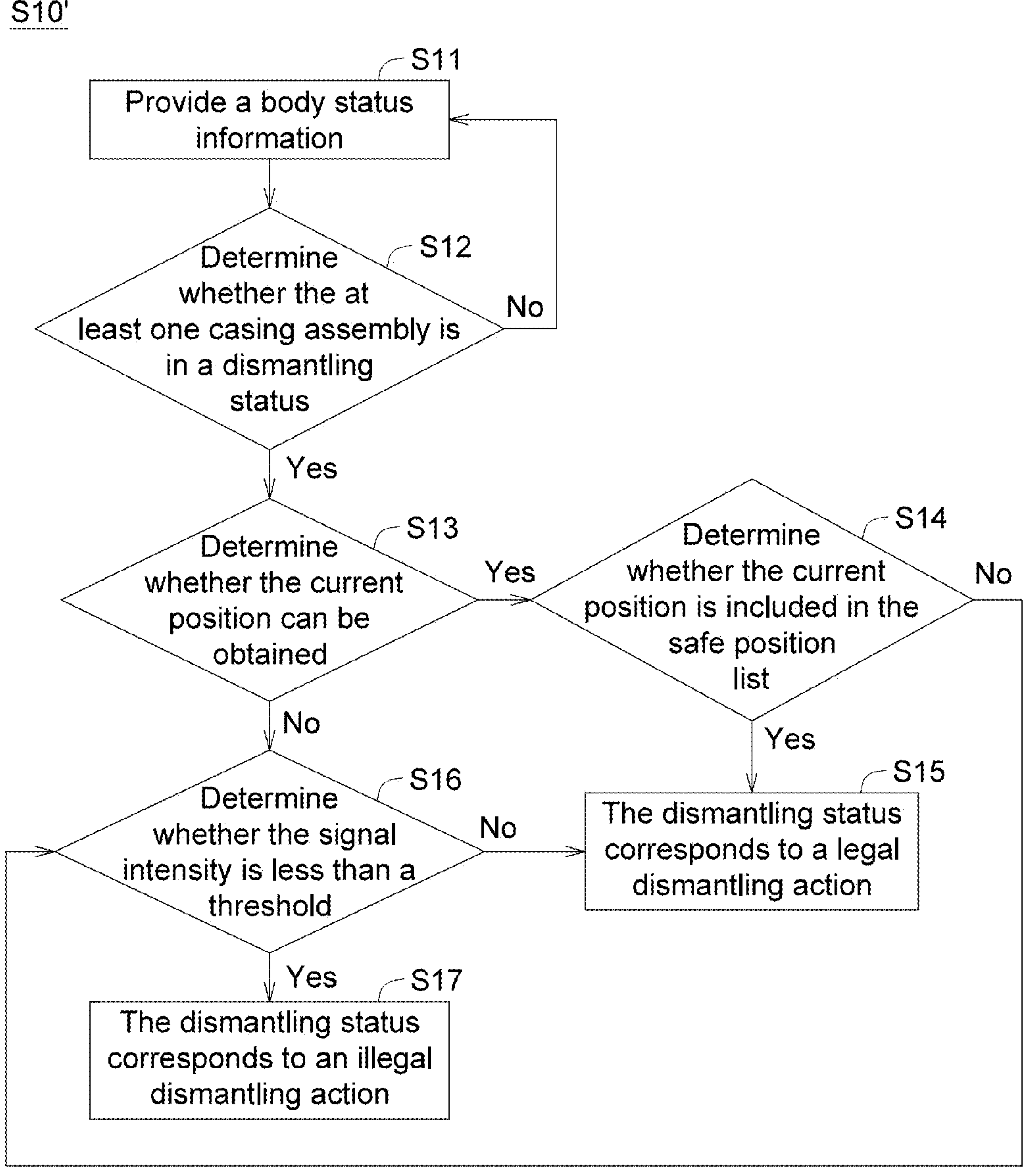
FIG. 5 is a flowchart of a dismantling status determination method of an unmanned aerial vehicle according to another embodiment of the invention.

FIG. 5 is a flowchart of a dismantling status determination method S10' of an unmanned aerial vehicle 10 according to another embodiment of the invention. Only the differences between the dismantling status determination method S10' of FIG. 5 and the dismantling status determination method S10 of FIG. 4 are described below. As for the common grounds and similarities are not repeated here.

The differences between the dismantling status determination method S10' of FIG. 5 and the dismantling status determination method S10 of FIG. 4 are as follows. In step S14, when the processing unit 124 determines that the current position of the unmanned aerial vehicle 10 is not included in the safe position list, the method proceeds to step S16, whether the intensity of the control signal S of the controller 13 is less than the threshold is determined by the processing unit 124, and whether the unmanned aerial vehicle 10 currently is within the control range of the controller 13 is determined according to the intensity of the control signal S of the controller 13, and the determination of intensity is used as a basis for determining whether the dismantling status is legal. That is, even the current position of the unmanned aerial vehicle 10 is not included in the pre-set safe position list, the dismantling action is determined as legal as long as the flight of the unmanned aerial vehicle 10 still can be controlled by using the controller 13.

According to the unmanned aerial vehicle disclosed above, when it is doubted that the unmanned aerial vehicle may be dismantled by an unauthorized person, the legitimacy of the dismantling action can be determined according to whether the current position of the unmanned aerial vehicle is included in the safe position list. Moreover, when it is determined that the dismantling action is illegal, the data stored in the storage unit and/or any storage device of the unmanned aerial vehicle will be erased to avoid confidential information being stolen by ill-intentioned people.

While the invention has been described by way of example and in terms of the preferred embodiment(s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. An unmanned aerial vehicle (UAV), comprising:

a casing, having at least one casing assembly; and a dismantling status determination system, comprising:

a dismantling detection unit, disposed on the at least one casing assembly of the unmanned aerial vehicle to provide a body status information according to whether the at least one casing assembly is detached;

a position detection unit, for detecting a current position of the unmanned aerial vehicle;

a storage unit, for storing a safe position list, wherein the safe position list is modifiable; and a processing unit, coupled to the dismantling detection unit, the position detection unit, and the storage unit, wherein the processing unit determines whether the current position is included in the safe position list in response to determining that the at least one casing assembly is in a dismantling status according to the body status information;

wherein the processing unit determines that the dismantling status corresponds to an illegal dismantling action in response to the current position not being included in the safe position list; and the processing unit adds a takeoff position to the safe position list according to the current position in response to the unmanned aerial vehicle taking off.

2. The unmanned aerial vehicle according to claim 1, further comprising:

a signal receiver, for receiving a control signal provided by a controller;

wherein the processing unit is further coupled to the signal receiver and determines whether the intensity of the control signal is less than a threshold;

wherein the processing unit determines that the dismantling status corresponds to the illegal dismantling action in response to the current position not being detected and the intensity of the control signal being less than the threshold.

3. The unmanned aerial vehicle according to claim 2, wherein the processing unit determines that the dismantling status corresponds to a legal dismantling action in response to the current position being included in the safe position list or the intensity of the control signal not being less than the threshold.

4. The unmanned aerial vehicle according to claim 1, further comprising:

a signal receiver, for receiving a control signal provided by a controller;

wherein the processing unit is further coupled to the signal receiver and determines whether the intensity of the control signal is less than a threshold;

wherein the processing unit determines that the dismantling status corresponds to the illegal dismantling action in response to the current position not being included in the safe position list and the intensity of the control signal being less than the threshold.

5. The unmanned aerial vehicle according to claim 4, wherein the processing unit determines that the dismantling status corresponds to a legal dismantling action in response to the current position being included in the safe position list or the intensity of the control signal not being less than the threshold.

6. The unmanned aerial vehicle according to claim 1, wherein the processing unit erases the data stored in the storage unit and/or any storage device of the unmanned aerial vehicle in response to determining that the dismantling status corresponds to the illegal dismantling action.

7. The unmanned aerial vehicle according to claim 1, wherein the dismantling detection unit is implemented by a Hall sensor disposed on the one of two mutually detachable components of the at least one casing assembly, wherein the dismantling detection unit senses the change in magnetic field then provides the body status information in response to the two components being apart from each other.

8. The unmanned aerial vehicle according to claim 1, wherein the at least one casing assembly is used to accommodate the storage unit and/or any storage device of the unmanned aerial vehicle, or the at least one casing assembly is used to accommodate a data transmission port via which data stored in the storage unit and/or the storage device can be accessed.

9. A dismantling status determination method used in an unmanned aerial vehicle comprising a casing having at least one casing assembly, wherein the dismantling status determination method comprises:

providing a body status information according to whether the at least one casing assembly is detached;

detecting a current position of the unmanned aerial vehicle;

determining whether the at least one casing assembly is in a dismantling status according to the body status information;

determining whether the current position is included in a safe position list stored in a storage unit in response to the at least one casing assembly being in the dismantling status, wherein the safe position list is modifiable;

determining that the dismantling status corresponds to an illegal dismantling action in response to the current position not being included in the safe position list; and adding a takeoff position to the safe position list according to the current position in response to the unmanned aerial vehicle taking off.

10. The dismantling status determination method according to claim 9, further comprising:

receiving a control signal provided by a controller;

determining whether the intensity of the control signal is less than a threshold; and determining that the dismantling status corresponds to the illegal dismantling action in response to the current position not being detected and the intensity of the control signal being less than the threshold.

11. The dismantling status determination method according to claim 10, wherein the dismantling status is determined to correspond to a legal dismantling action in response to the current position being included in the safe position list or the intensity of the control signal not being less than the threshold.

12. The dismantling status determination method according to claim 9, further comprising:

receiving a control signal provided by a controller;

determining whether the intensity of the control signal is less than a threshold; and determining that the dismantling status corresponds to the illegal dismantling action in response to the current position not being included in the safe position list and the intensity of the control signal being less than the threshold.

13. The dismantling status determination method according to claim 12, wherein the dismantling status is determined to correspond to a legal dismantling action in response to the current position being included in the safe position list or the intensity of the control signal not being less than the threshold.

14. The dismantling status determination method according to claim 9, wherein the data stored in the storage unit and/or any storage device of the unmanned aerial vehicle is erased in response to determining that the dismantling status corresponds to the illegal dismantling action.

15. The dismantling status determination method according to claim 9, wherein in the step of providing the body status information according to whether the at least one casing assembly is detached, the dismantling detection unit senses the change in magnetic field then provides the body status information in response to two mutually detachable components of the at least one casing assembly being apart from each other.

16. The dismantling status determination method according to claim 9, wherein the at least one casing assembly is used to accommodate the storage unit and/or any storage device of the unmanned aerial vehicle, or the at least one casing assembly is used to accommodate a data transmission port via which data stored in the storage unit and/or the storage device can be accessed.

* * * * *